(12) United States Patent
Hanamoto

(10) Patent No.: US 11,856,835 B2
(45) Date of Patent: Dec. 26, 2023

(54) METHOD FOR MANUFACTURING DISPLAY DEVICE

(71) Applicant: SHARP KABUSHIKI KAISHA, Sakai (JP)

(72) Inventor: Tetsuya Hanamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 500 days.

(21) Appl. No.: 17/278,941

(22) PCT Filed: Sep. 27, 2018

(86) PCT No.: PCT/JP2018/036057
§ 371 (c)(1),
(2) Date: Mar. 23, 2021

(87) PCT Pub. No.: WO2020/065856
PCT Pub. Date: Apr. 2, 2020

(65) Prior Publication Data
US 2022/0037629 A1 Feb. 3, 2022

(51) Int. Cl.
*H10K 71/00* (2023.01)
*H10K 59/122* (2023.01)
*H10K 59/12* (2023.01)
*H10K 71/80* (2023.01)
*H10K 102/00* (2023.01)

(52) U.S. Cl.
CPC ......... *H10K 71/00* (2023.02); *H10K 59/1201* (2023.02); *H10K 59/122* (2023.02); *H10K 71/80* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 2005/0110785 A1* | 5/2005 | Ochiai | G09G 3/3233 345/206 |
| 2007/0105285 A1* | 5/2007 | Kusumoto | H10K 71/80 257/E29.147 |
| 2011/0073847 A1* | 3/2011 | Kobayashi | H10K 77/111 257/40 |
| 2011/0204361 A1* | 8/2011 | Nishiki | H01L 27/1266 257/E33.056 |
| 2014/0138032 A1* | 5/2014 | Kweon | G02F 1/1303 156/753 |

(Continued)

FOREIGN PATENT DOCUMENTS

JP  2018010232 A  1/2018

*Primary Examiner* — Evren Seven
(74) *Attorney, Agent, or Firm* — ScienBiziP, P.C.

(57) ABSTRACT

A method for manufacturing a display device including a light-emitting element, the method includes: storing, in a manufacturing process of the display device, a plurality of abutting positions where a back face of a support substrate locally abuts a manufacturing apparatus; forming, on a surface of the support substrate on a side on which the light-emitting element is to be formed, a peeling layer at a position opposing at least one position of the plurality of abutting positions stored; forming, on the support substrate, a resin layer to cover the peeling layer; forming a TFT layer on the resin layer; forming the light-emitting element on the TFT layer; and peeling the support substrate and the resin layer.

16 Claims, 7 Drawing Sheets

(56) References Cited

U.S. PATENT DOCUMENTS

2017/0345849 A1* 11/2017 Kinoshita ............ B23K 26/127
2018/0019418 A1* 1/2018 Sonoda .............. H10K 50/8426
2018/0108874 A1* 4/2018 Tanaka ................ B23K 26/064

* cited by examiner

METHOD FOR MANUFACTURING DISPLAY DEVICE

TECHNICAL FIELD

The disclosure relates to a method for manufacturing a display device.

BACKGROUND ART

A flexible organic light-emitting diode (OLED) is made by the steps of (i) forming a resin layer (e.g., polyimide) on a support substrate (e.g., glass), (ii) forming a light-emitting element on the resin layer, (iii) protecting, with a protection film, a region where the light-emitting element is formed, (iv) irradiating an interface between the support substrate and the resin layer with laser light from a back face side of the support substrate (a surface on the back face side of the surface on which the light-emitting element is formed), and (v) peeling the resin layer from the support substrate (for example, see PTL 1).

CITATION LIST

Patent Literature

PTL 1: JP 2018-10232 A

SUMMARY

Advantageous Effects of Disclosure

However, upon irradiating an interface between a support substrate and a resin layer with laser light, when defects (e.g., marks or adhesion of foreign matter) exist on a back face of the support substrate, the interface between the support substrate and the resin layer cannot be irradiated with laser light of sufficient power. As a result, problems occur such as (a) the occurrence of peeling failure upon peeling the resin layer from the support substrate, and/or (b) the occurrence of peeling failure of a flexible OLED during a manufacturing process of a display device, making it impossible to manufacture the desired display device.

An aspect of the disclosure is to achieve a method for manufacturing a display device, which allows for easy peeling of the support substrate and the resin layer.

Solution to Problem

In order to solve the above problem, a method for manufacturing a display device according to an embodiment of the disclosure is a method for manufacturing a display device including a light-emitting element, the method including storing, in a manufacturing process of the display device, a plurality of abutting positions where a back face of a support substrate locally abuts a manufacturing apparatus, forming, on a surface of the support substrate on a side on which the light-emitting element is to be formed, a peeling layer at a position opposing at least one position of the plurality of abutting positions stored, forming, on the support substrate, a resin layer to cover the peeling layer, forming a TFT layer on the resin layer, forming the light-emitting element on the TFT layer, and peeling the support substrate and the resin layer.

Advantageous Effects of Invention

According to an aspect of the disclosure, a support substrate and a resin layer can be easily peeled.

DESCRIPTION OF EMBODIMENTS

Various embodiments will be described below. Note that the aforementioned display device is not particularly limited, and examples thereof include a display device including an organic light-emitting diode (OLED), a quantum dot light-emitting diode (QLED), a micro light-emitting diode (MLED), or the like.

1. First Embodiment

Figure 1:
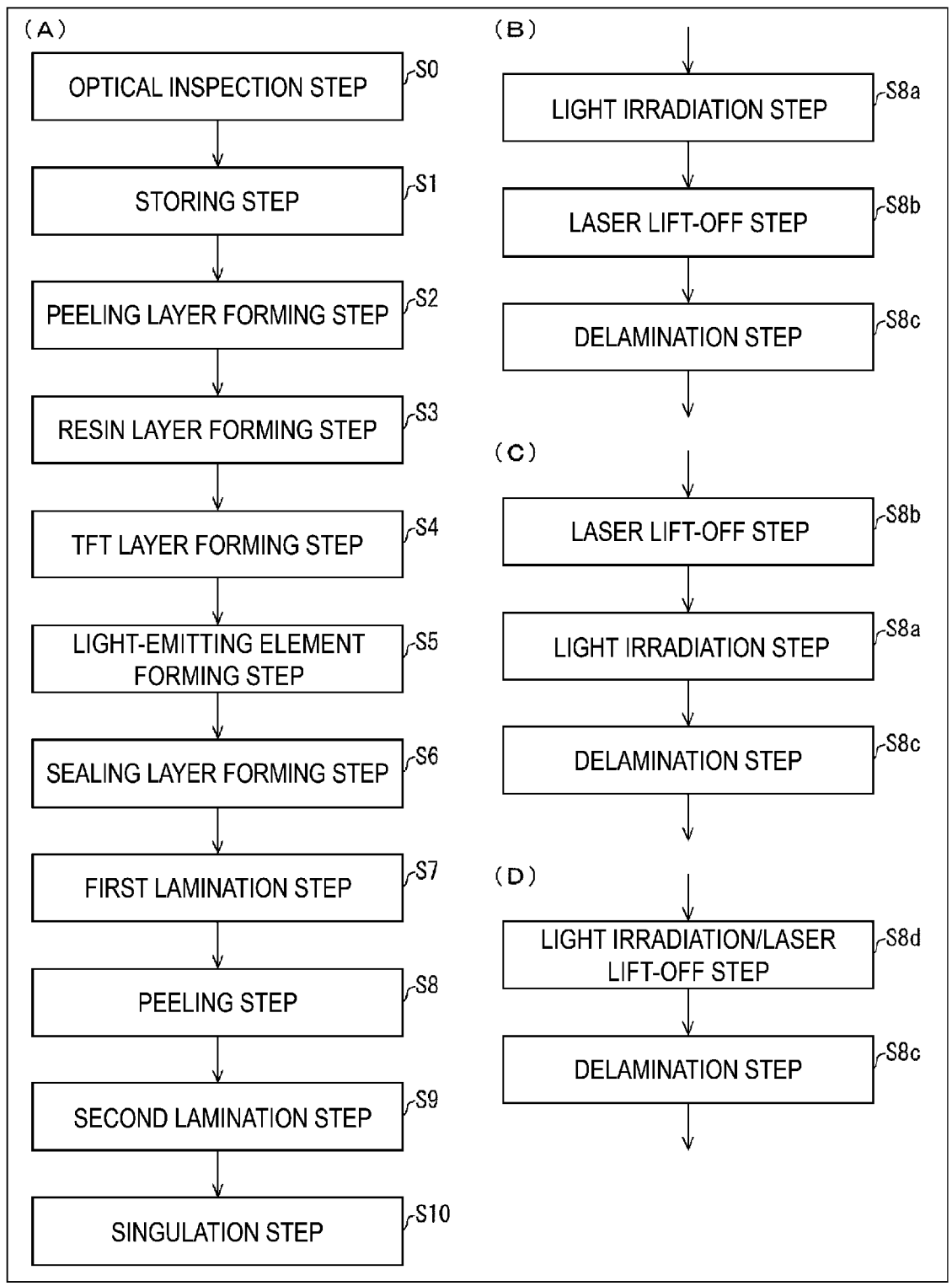
FIG. 1(A) is a flowchart illustrating an example of a method for manufacturing a display device.
FIGS. 1(B) to 1(D) are flowcharts illustrating examples of a peeling step.

FIG. 1(A) is a flowchart illustrating an example of a method for manufacturing a display device. The method for manufacturing the display device according to the present embodiment includes an optical inspection step S0, a storing step S1, a peeling layer forming step S2, a resin layer forming step S3, a TFT layer forming step S4, a light-emitting element forming step S5, a sealing layer forming step S6, a first lamination step S7, a peeling step S8, a second lamination step, and a singulation step S10. FIGS. 1(B) to 1(D) are flowcharts illustrating examples of the peeling step. Each of the above-mentioned steps is described below.

Optical Inspection Step S0

The optical inspection step S0 is a step of observing a back face of a support substrate to detect a mark formed on the back face, and measuring a position of the detected mark. For example, the back face of the support substrate may be observed by automated optical inspection (AOI), etc. to detect a mark formed on the back face and measure the position of the detected mark. The position of the mark may be stored in the storing step S1, which will be described later.

Storing Step S1

In a manufacturing process of the display device, various materials such as a resin layer are layered on a surface of the support substrate. At this time, since the back face of the support substrate is exposed, various defects (marks, adhesion of foreign matter, etc.) can occur on the back face of the support substrate when the support substrate is transported, during installation or positioning of the support substrate in a film formation apparatus, or during film formation.

In the storing step S1, in the manufacturing process of the display device, a plurality of abutting positions where the back face of the support substrate locally abuts the manufacturing apparatus (hereinafter also referred to as first regions) are stored. In other words, in the storing step S1, when the display device is actually mass-produced, the plurality of abutting positions where the back face of the support substrate locally abuts the manufacturing apparatus are stored in advance. Note that in the storing step S1, it is not necessary to store all of the first regions.

The support substrate serves as a support for layering various materials when manufacturing the display device. For example, a transparent mother substrate (for example, a glass substrate) is used as the support substrate.

The size of each of the defects is not particularly limited. The depth of the defect (specifically, the depth in a layering direction of the support substrate and resin layer) may be, for example, 100 nm or greater and 20 µm or less. Note that when the depth within one defect is not uniform, the depth of the deepest portion may be the configuration described above. When an area of the defect (specifically, the area in a plane perpendicular to the layering direction of the support substrate and the resin layer) is (20 µm×20 µm) or greater, it becomes more difficult to irradiate an interface between the support substrate and the resin layer with laser light from the back face side of the support substrate. Thus, the area of the defect of interest of the disclosure may be, for example, (20 µm×20 µm) or greater and (1000 µm×1000 µm) or less. Note that when the area within one defect is not uniform, the area of the widest portion may be the configuration described above. Note that in the above description, the area of the defect is defined as having the same size for both vertical and horizontal lengths, but when one length of the vertical and horizontal lengths is 20 µm or greater, the irradiation of the interface between the support substrate and the resin layer with the laser light may be difficult. Therefore, the disclosure is effective for defects having a length in at least one direction of both the vertical and horizontal directions of 20 µm or greater.

The shape of the defect in the disclosure is not limited to a square or a rectangle. The shape of the defect is any shape that can be formed on a back face of a certain area of the support substrate, such as a circular, elliptical, or dot-shaped mass of foreign matter, or a collection of marks.

In the case of mass production of display devices, each of the individual display devices is manufactured via the same steps. In this case, defects are more likely to occur in substantially the same region in the back face of the individual support substrates, and less likely to occur accidentally in different regions in the back face of the individual support substrates. Accordingly, in the storing step S1, in the manufacturing process of the display device, it is preferable to store the plurality of abutting positions where the back face of the support substrate locally abuts the manufacturing apparatus. According to the configuration described above, regions where the defects occur at a high probability are stored as the first regions, and thus, (a) peeling failure of the support substrate and the resin layer can be better prevented, (b) when peeling the support substrate and the resin layer, localized stress applied to the resin layer can be reduced, (c) by suppressing peeling of the light-emitting element from the display device, light emission failure of the light-emitting element can be suppressed, and/or (d) the manufacturing yield of the display device can be improved.

Figure 6:
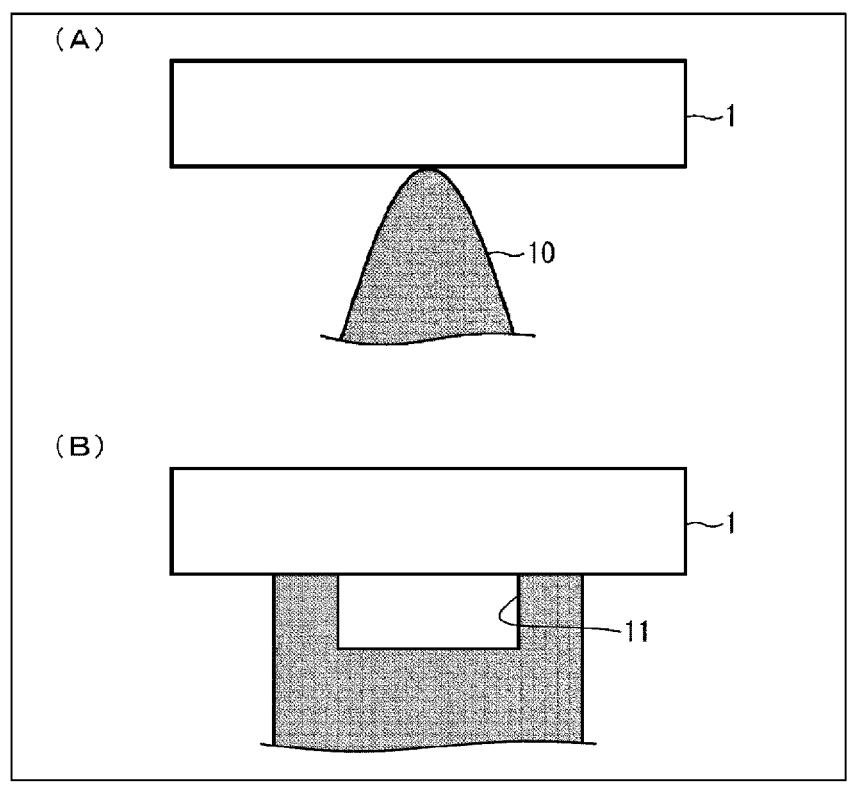
FIGS. 6(A) and 6(B) are cross-sectional views illustrating abutting positions where a back face of a support substrate locally abuts a manufacturing apparatus in a manufacturing process of the display device.

Examples of the regions where the manufacturing apparatus and the support substrate of the display device abut each other include (i) a region where a support pin provided in the manufacturing apparatus and the support substrate abut each other, (ii) a region where a vacuum adsorption port provided in the manufacturing apparatus and the support substrate abut each other, (iii) a region where a film formation apparatus (for example, a vapor deposition apparatus and an etching apparatus) provided in the manufacturing apparatus and the support substrate abut each other, and (iv) a region where a transport device (for example, a stage) provided in the manufacturing apparatus and the support substrate abut each other. For example, FIG. 6(A) is a cross-sectional view illustrating a support pin 10 of the manufacturing apparatus abutting a support substrate 1 in the manufacturing process of the display device, and FIG. 6(B) is a cross-sectional view illustrating a vacuum adsorption port 11 of the manufacturing apparatus abutting the support substrate 1 in the manufacturing process of the display device.

Peeling Layer Forming Step S2

In the peeling layer forming step S2, on a surface of the support substrate on a side on which a light-emitting element is to be formed, a peeling layer is formed at a position opposing at least one of the above-mentioned plurality of abutting positions stored. In other words, in the peeling layer forming step S2, the peeling layer is formed on each of second regions in the surface of the support substrate opposing corresponding ones of the first regions. Note that the peeling layer can be formed by a well-known method such as application, vapor deposition, and/or etching.

The peeling layer reduces a bonding force between the support substrate and the resin layer. More specifically, the peeling layer may be a layer that reduces the bonding force between the support substrate and the resin layer by reducing a bonding force between the peeling layer and the support substrate and/or a bonding force between the peeling layer and the resin layer. Furthermore, the peeling layer may be a layer that breaks the bond between the support substrate and the resin layer by breaking the bond between the peeling layer and the support substrate and/or the bond between the peeling layer and the resin layer.

More specifically, examples of the peeling layer include a silicon-based peeling film, a UV peeling film, a metal-based peeling film, a photocatalyst-based peeling film, and an interface modification film.

Examples of the silicon-based peeling film include an amorphous silicon film, a silicon oxide film, and a silicon nitride film. The adhesive force between the silicon-based peeling film and the resin layer (for example, a polyimide layer) formed thereon is lower than the adhesive force between the support substrate and the resin layer, and therefore, the silicon-based peeling film is easily peelable without irradiation with light; however, if the silicon-based peeling film is irradiated with light (for example, laser light), hydrogen gas is generated from the silicon-based peeling film. The bonding force between the support substrate and the resin layer can be reduced by the hydrogen gas. Note that when peeling the support substrate and the resin layer in the steps described below, the silicon-based peeling film may remain on the support substrate side.

Examples of the UV peeling film include a silicone-modified material and a non-silicone based material. When the UV peeling film is irradiated with ultraviolet light, the physical properties of the UV peeling film change. Due to the change in the physical properties, the bonding force between the support substrate and the resin layer can be reduced. Note that when peeling the support substrate and the resin layer in the steps described below, the UV peeling film may remain on the resin layer side.

Examples of the metal-based peeling film include (i) a film formed by a carrier metal such as molybdenum, titanium, aluminum, gallium, indium, tungsten film, or zinc, (ii) a film formed by alloys thereof, and (iii) combinations of films thereof. When the metal-based peeling film is irradiated with light (for example, laser light), the temperature of the metal-based peeling film increases. Since the linear expansion coefficient of the metal-based peeling film is different from the linear expansion coefficient of the resin layer, the bonding force between the metal-based peeling film and the resin layer decreases when the metal-based peeling film is irradiated with light. As a result, the bonding force between the support substrate and the resin layer can be reduced. Note that when peeling the support substrate and the resin layer in the steps described below, the metal-based peeling film may remain on the support substrate side.

Examples of the photocatalyst-based peeling film include a titanium oxide film. When the photocatalyst-based peeling film is irradiated with light (for example, ultraviolet light), the bonding force between the photocatalyst-based peeling film and the resin layer decreases. As a result, the bonding force between the support substrate and the resin layer can be reduced. Note that when peeling the support substrate and the resin layer in the steps described below, the photocatalyst-based peeling film may remain on the support substrate side.

Examples of the interface modification film include various resin films that have been subjected to a chemical bonding (CB) process using a silane coupling agent, as well as a metal film, etc. Note that the interface modification film can be formed by modifying the surface of the support substrate. The interface modification film has a property that the bonding force between the interface modification film and the support substrate and/or the bonding force between the interface modification film and the resin layer is small. Thus, the bonding force between the support substrate and the resin layer can be reduced. For example, when the interface modification film is hydrophilic, the support substrate and/or resin layer can be hydrophobic, and when the interface modification film is hydrophobic, the support substrate and/or resin layer can be hydrophilic. Note that when peeling the support substrate and the resin layer in the steps described below, the interface modification film may remain on the support substrate side.

The film thickness of the peeling layer (specifically, the thickness in the layering direction of the support substrate and the peeling layer) is preferably as thin as possible from the perspective of flattening the resin layer formed on the peeling layer in the steps described below. The film thickness of the peeling layer is, for example, 20 μm or less, preferably 10 μm or less, and most preferably 10 μm or less. The lower limit of the film thickness of the peeling layer is not limited and may be 100 nm or 500 nm. Note that when the film thickness within one peeling layer is not uniform, the film thickness of the thickest portion may be the configuration described above.

An area of the peeling layer (specifically, an area in a plane perpendicular to the layering direction of the support substrate and the peeling layer) may be set according to the area of the first regions and the second regions. For example, the area of the peeling layer is preferably set so that the area of each of the first regions and the area of the peeling layer are substantially the same. With this configuration, the resin layer formed on the peeling film can be made flatter.

When the area of each region of the first regions is (20 μm×20 μm) or greater, it becomes more difficult to irradiate an interface between the support substrate and the resin layer with laser light from the back face side of the support substrate. Thus, the area of the peeling layer for one defect is, for example, (20 μm×20 μm) or less, preferably (30 μm×30 μm) or less, and most preferably (50 μm×50 μm) or less. The upper limit of the area of the peeling layer is not limited and may be (20 μm×500 μm) or (100 μm×100 μm) for one defect. Note that when the area in one peeling layer is not uniform, the area of the widest portion may be the configuration described above.

The shape of the peeling layer (specifically, the shape in a plane perpendicular to the layering direction of the support substrate and the peeling layer) is not limited and may be circular, elliptical, or polygonal (e.g. square or rectangular). As described below, when forming one peeling layer per the plurality of second regions, the shape of the peeling layer is preferably a shape (for example, an elliptical or rectangular shape) having a long straight portion (for example, a straight portion with a length of 100 μm or more or 500 μm or more). When the shape of the peeling layer is such a shape, a portion of the resin layer formed on the long straight portion can be formed into a flattened long region. Further, a display device having a desired performance can be manufactured by forming a TFT layer and the light-emitting element, which will be described below, on the flattened long region.

The peeling layer preferably has a rounded shape without corners (in other words, an edge portion of the peeling layer is formed preferably in a cross-sectional R shape). In a case where the peeling layer has a shape having corners, upon forming the resin layer on the peeling layer, an excessive amount of resin remains in the vicinity of the corners. Therefore, variation in the thickness of the resin layer easily occurs, and unevenness in the surface of the resin layer easily occurs. When the peeling layer has a rounded shape without corners, the occurrence of variation in the thickness of the resin layer and the occurrence of unevenness in the surface of the resin layer can be prevented. In addition, the peeling layer having a rounded shape without a corners can prevent the resin layer from being broken by the corners of the peeling layer.

Figure 5:
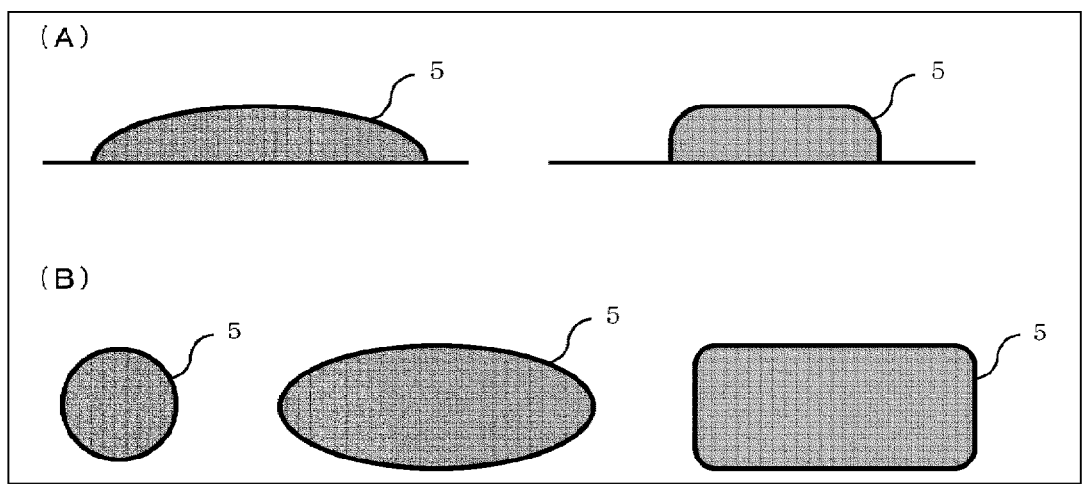
FIG. 5(A) is a cross-sectional view illustrating examples of a peeling layer.
FIG. 5(B) is a plan view illustrating examples of the peeling layer.

FIG. 5(A) is a cross-sectional view illustrating examples of the peeling layer (cross-sectional view in the layering direction of the support substrate and the peeling layer), and FIG. 5(B) is a plan view illustrating examples of the peeling layer (a cross-sectional view in a direction perpendicular to the layering direction of the support substrate and the peeling layer). An example of the peeling layer having a rounded shape without a corners is described in these drawings. As illustrated in FIG. 5(A), the peeling layer may be formed so that an inclination angle gradually decreases in a height direction (in other words, forms a circular arc).

In the peeling layer forming step S2, when the plurality of abutting positions (in other words, marks) are detected in the storing step S1, the peeling layer may be formed for each detected abutting position of the plurality of abutting positions (in other words, the marks). For example, in the peeling layer forming step S2, when the plurality of abutting positions are stored in the storing step S1, one peeling layer may be formed per one second region of the plurality of second regions. With this configuration, a small peeling layer that is tailored to the size of the defect can be formed. In the case of a small peeling layer, the occurrence of variation in the thickness of the resin layer formed on the peeling layer, and the occurrence of unevenness in the surface of the resin layer can be prevented.

In the peeling layer forming step S2, when the plurality of abutting positions (in other words, the marks) are detected in the storing step S1, the peeling layer may be formed to cover the detected plurality of abutting positions (in other words, the marks). For example, in the peeling layer forming step S2, when the plurality of abutting positions are stored in the storing step S1, one peeling layer may be formed for the plurality of second regions. With this configuration, since a large peeling layer is formed, the probability of forming the peeling layer on the regions in the surface of the support substrate opposing the regions where accidental defects occur in the back face of the support substrate can be increased.

The manufacturing process of the display device may also include a step in which it is desired that the support substrate and the resin layer are strongly bonded to each other and integrated with each other. From the perspective of handling of the display device during manufacturing, the peeling layer is preferably formed on a portion of the surface of the support substrate.

Resin Layer Forming Step S3

The resin layer forming step S3 is a step of forming a resin layer on the support substrate so as to cover the peeling layer. Note that the resin layer can be formed by a known method (for example, application).

An example of the resin layer is a polyimide film. Further, the resin layer can be two resin films (for example, polyimide films) with an inorganic insulating film sandwiched therebetween. The shape of the resin layer is not particularly limited as long as the resin layer is capable of covering the peeling layer and is capable of forming the TFT layer, and the light-emitting element, which will be described below, on the resin layer.

TFT Layer Forming Step S4

The TFT layer forming step S4 is a step of forming a thin film transistor (TFT) layer on the resin layer. Note that the TFT layer can be formed by a known method.

Light-Emitting Element Forming Step S5

The light-emitting element forming step S5 is a step of forming a light-emitting element on the TFT layer. Note that the number of light-emitting elements formed on the TFT layer is not particularly limited. The light-emitting element may be formed by a known method.

A light-emitting element layer is formed by, for example, layering a hole transport layer, a light-emitting layer, and an electron transport layer in order from a lower layer side. In the present embodiment, at least one layer of the light-emitting layer is formed by a vapor deposition method. Further, in the present embodiment, each layer of the light-emitting layer may be formed in an island shape for each subpixel SP, or may be formed in a solid-like shape as a common layer for the plurality of subpixels SP.

In a case where the light-emitting element layer is an OLED layer, holes and electrons are recombined inside the light-emitting layer due to a drive current between a pixel electrode and an upper electrode, and excitons generated in accordance therewith fall to a ground state, whereby light is emitted. The upper electrode is transparent and the pixel electrode reflects light, and thus light emitted from the light-emitting element layer is directed upward as top emission.

A sealing layer is formed on top of the light-emitting element layer. The sealing layer includes a first inorganic sealing film above the upper electrode, an organic sealing film above the first inorganic sealing film, and a second inorganic sealing film above the organic sealing film, and prevents foreign matter such as water and oxygen from penetrating into the light-emitting element layer.

Sealing Layer Forming Step S6

The sealing layer forming step S6 is a step of forming a sealing layer that seals the light-emitting element. The sealing layer forming step S6 may be performed after the light-emitting element forming step S5.

The sealing layer can prevent foreign matter (e.g., water, oxygen, etc.) from penetrating the light-emitting element. The sealing layer can be formed by a known method (e.g., CVD or application). For example, an inorganic sealing film, an organic sealing film, or a layered film thereof can be used as the sealing layer. More specifically, a silicon oxide film, a silicon nitride film, a silicon oxynitride film, or a layered film thereof can be used.

First Lamination Step S7

The first lamination step S7 is a step of applying a first lamination film onto the sealing layer. The first lamination step S7 may be performed after the sealing layer forming step S6.

The first lamination film can protect the light-emitting element. The first lamination film can be formed by a known method (e.g., application). For example, a PET (polyethylene terephthalate) film can be used as the first lamination film.

Peeling Step S8

The peeling step S8 is a step of peeling the support substrate and the resin layer.

As illustrated in FIG. 1(B) and FIG. 1(C), the peeling step S8 may include a light irradiation step 8a for radiating light for peeling the peeling layer from the support substrate, a laser lift-off step 8b for peeling the resin layer from the support substrate, and a delaminating step 8c for peeling the resin layer from the support substrate.

In the light irradiation step 8a, the bonding force between the peeling layer and the support substrate may be reduced by irradiating the peeling layer with light (for example, laser light, ultraviolet light, etc.). In the laser lift-off step 8b, the resin layer may be peeled from the support substrate by irradiating the interface between the support substrate and the resin layer with laser light (for example, excimer laser light). In the delamination step 8c, the resin layer may be peeled from the support substrate by applying force to the layered body including the support substrate, the peeling layer, and the resin layer. For example, when the peeling layer is a UV peeling film, the material including the support substrate and the material including the resin layer and the peeling layer may be recovered in the delamination step 8c. As illustrated in FIG. 1(B) and FIG. 1(C), the light irradiation step 8a and the laser lift-off step 8b can be performed at different timings.

As illustrated in FIG. 1(D), the peeling step S8 may include a light irradiation/laser lift-off step 8d in which the light irradiation step 8a and the laser lift-off step 8b are performed simultaneously, and the delamination step 8c. From the perspective of simplifying the method for manufacturing the display device, the step illustrated in FIG. 1(D) is preferable.

Second Lamination Step S9

The second lamination step S9 is a step of bonding a second lamination film onto the resin layer. The second lamination step S9 may be performed after the peeling step S8.

The second lamination film provides strength to the layered body including the resin layer and the light-emitting element, which allows for improved handling of the layered body. For example, a PET film can be used as the second lamination film.

Singulation Step S10

The singulation step S10 is a step of dividing the layered body in which various materials are layered into units of the display device. The singulation step S10 may be performed after the second lamination step S9. More specifically, in the singulation step S10, display devices are individually obtained by singulation of cutting a composite of: the layered body including the resin layer and a plurality of the light-emitting elements; and the second lamination film.

Note that, for the above-described storing step S1, it is not necessary to process the storing step S1 for each substrate, and the storing step can be shared in each lot unit.

Display Device

An example of the display device manufactured by the manufacturing method of the present embodiment will be described below.

Figure 7:
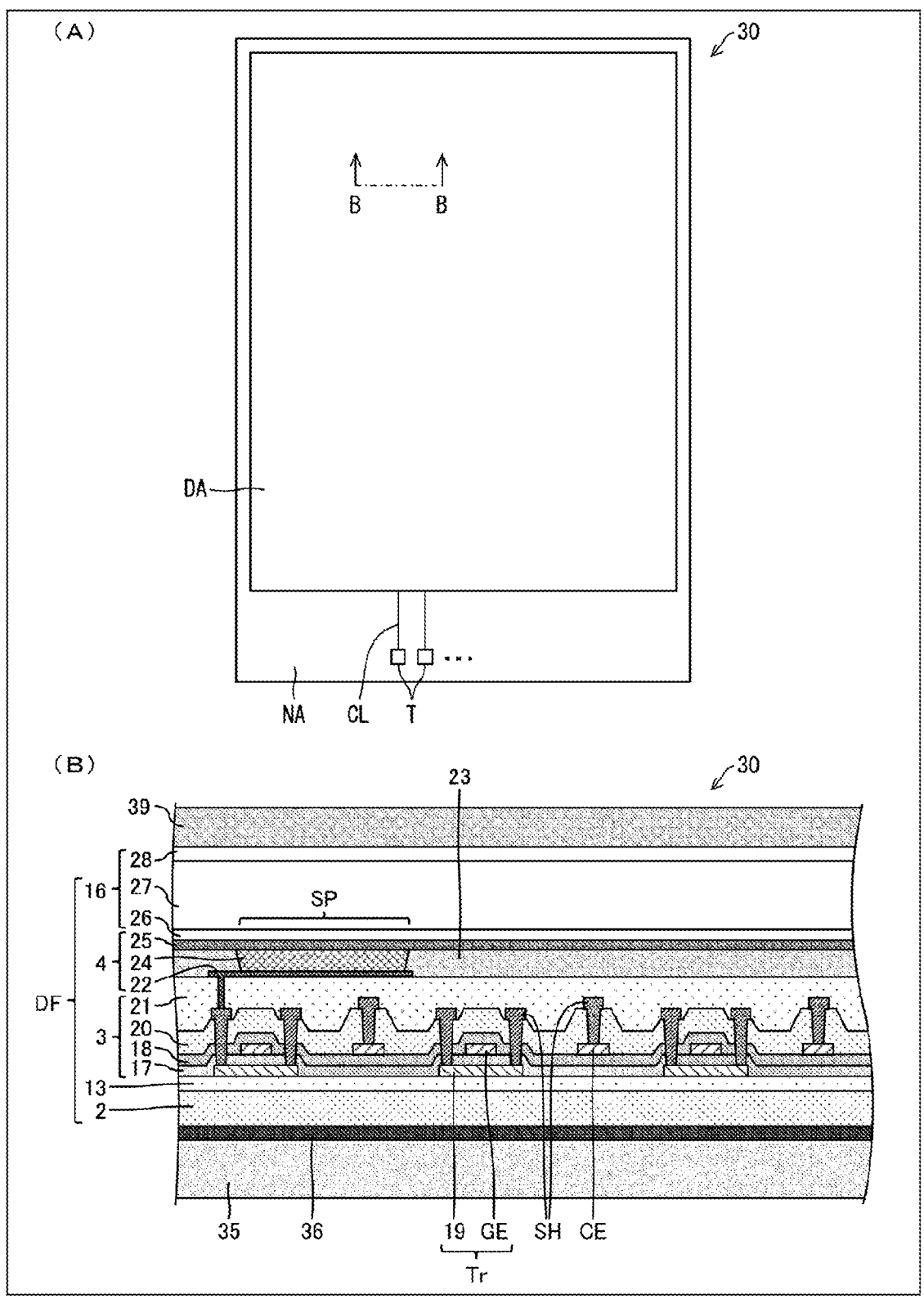
FIG. 7(A) is a top view of the display device according to an embodiment of the disclosure.
FIG. 7(B) is a cross-sectional view taken along the line B-B in the top view.

FIG. 7(A) is a top view of a display device 30. FIG. 7(B) is a cross-sectional view taken along the line B-B in FIG. 7(A). As illustrated in FIG. 7(A), the display device 30 according to the present embodiment includes a display region DA and a frame region NA adjacent to the periphery of the display region DA. A terminal portion T is formed on one end portion of the frame region NA, as illustrated in FIG. 7(A). A driver or the like (not illustrated) that supplies a signal for driving each light-emitting element in the display region DA via a connection wiring line CL from the display region DA, is mounted on the terminal portion T.

With reference to FIG. 7(B), the configuration of each layer in the display region DA of the display device 30 of the present embodiment will be explained in detail.

As illustrated in FIG. 7(B), the display device 30 of the present embodiment includes, in order from the bottom layer, a lower face film 35, an adhesive layer 36, a resin layer 2, a barrier layer 13, a TFT layer 3, a light-emitting element (light-emitting element layer) 4, and a sealing layer 16. The display device 30 may include a function film 39 having an optical compensation function, a touch sensor function, a protection function, etc. on a further upper layer of the sealing layer 16.

The lower face film 35 is a base material film of the display device 30, and may include, for example, an organic resin material. The adhesive layer 36 is a layer that adheres the lower face film 35 and the resin layer 2 to each other. The adhesive layer 36 may be formed using a known adhesive. The resin layer 2 includes polyimide (hereinafter also referred to as PI) as a material.

The barrier layer 13 is a layer that prevents foreign matter such as water and oxygen from penetrating the TFT layer 3 and the light-emitting element 4 when the display device 30 is used. The barrier layer 13 may be composed of, for example, a silicon oxide film, a silicon nitride film, or a silicon oxynitride film formed by CVD, or a layered film thereof.

The TFT layer 3 includes, in order from the bottom layer, a semiconductor film 19, a first inorganic insulating film 17 (gate insulating film), a gate electrode GE, a second inorganic insulating film 18, a capacitance electrode CE, a third inorganic insulating film 20, a source wiring line SH (metal wiring line layer), and a flattening film 21 (interlayer insulating film). A thin film transistor (TFT) Tr is configured to include the semiconductor film 19, the first inorganic insulating film 17, and the gate electrode GE.

The semiconductor film 19 is formed of, for example, low-temperature polysilicon (LTPS) or an oxide semiconductor. Although the TFT is illustrated in FIG. 7(A) as including the semiconductor film 19 as a channel and having a top gate structure, the TFT may have a bottom gate structure (for example, in a case where the channel of the TFT is an oxide semiconductor).

The gate electrode GE, the capacitance electrode CE, and the source wiring line SH may include, for example, at least one of aluminum (Al), tungsten (W), molybdenum (Mo), tantalum (Ta), chromium (Cr), titanium (Ti), and copper (Cu). In other words, the gate electrode GE, the capacitance electrode CE, or the source wiring line SH is composed of a single-layer film or a layered film of the above-mentioned metals.

The third inorganic insulating film 17, the first inorganic insulating film 18, and the second inorganic insulating film 20 can be composed of, for example, a silicon oxide (SiOx) film or a silicon nitride (SiNx) film formed using CVD, or a layered film thereof.

The flattening film 21 can be composed of a coatable photosensitive organic material such as polyimide or acryl.

The light-emitting element 4 (for example, an organic light-emitting diode layer) includes a pixel electrode 22 (a first electrode, for example, an anode), a cover film (edge cover) 23 covering the edge of the pixel electrode 22, a light-emitting layer 24, and an upper electrode (a second electrode, for example, a cathode) 25 in order from a bottom layer. In the light-emitting element 4, a light-emitting element (for example, an organic light-emitting diode (OLED)) that includes the island-shaped pixel electrode 22, the island-shaped light-emitting layer 24, and the upper electrode 25, as well as a subpixel circuit that drives the light-emitting element are provided for each of a plurality of subpixels SP (pixel). In the TFT layer 3, the transistor Tr is formed for each subpixel circuit, and the subpixel circuit is controlled by the control of the transistor Tr.

In plan view, the pixel electrode 22 is provided at a position where the pixel electrode 22 overlaps the flattening film 21 and a contact hole that is an opening in the flattening film 21. The pixel electrode 22 is electrically connected to the source wiring line SH through the contact hole. Therefore, a signal in the TFT layer 3 is supplied to the pixel electrode 22 via the source wiring line SH. Note that the thickness of the pixel electrode 22 may be, for example, 2 nm.

The pixel electrode 22 is formed into an island shape for each of the plurality of subpixels SP and is formed by, for example, layering indium tin oxide (ITO) and an alloy containing Ag, and has light reflectivity. The upper electrode 25 is formed into a solid shape as a common layer for the plurality of subpixels SP and can be composed of a transparent conductive material such as indium tin oxide (ITO) or indium zinc oxide (IZO).

The cover film 23 is an organic insulating film, and is formed at a position covering an edge of the pixel electrode 22. The cover film 23 includes an opening 23c for each of the plurality of subpixels SP. A portion of the pixel electrode 22 is exposed. The cover film 23 can be composed of, for example, a coatable material such as polyimide.

The light-emitting layer 24 is formed by, for example, layering a hole transport layer, a light-emitting layer, and an electron transport layer in order from the lower layer side. In the present embodiment, at least one layer of the light-emitting layer 24 is formed by a vapor deposition method. Further, in the present embodiment, each layer of the light-emitting layer 24 may be formed in an island shape for each subpixel SP, or may be formed in a solid-like shape as a common layer for the plurality of subpixels SP.

In a case where the light-emitting element 4 is an OLED layer, holes and electrons are recombined inside the light-emitting layer 24 due to a drive current between the pixel electrode 22 and the upper electrode 25, and excitons generated in accordance therewith fall to a ground state, whereby light is emitted. The upper electrode 25 is transparent and the pixel electrode 22 reflects light, and thus light emitted from the light-emitting layer 24 is directed upward as top emission.

The sealing layer 16 includes a first inorganic sealing film 26 above the upper electrode 25, an organic sealing film 27 above the first inorganic sealing film 26, and a second inorganic sealing film 28 above the organic sealing film 27, and prevents foreign matter such as water and oxygen from penetrating into the light-emitting element 4. The first inorganic sealing film 26 and the second inorganic sealing film 28 can be composed of, for example, a silicon oxide film, a silicon nitride film, or a silicon oxynitride film formed by CVD, or a layered film thereof. The organic sealing film 27 can be formed of a coatable photosensitive organic material such as a polyimide or an acrylic.

2. Second Embodiment

Figure 2:
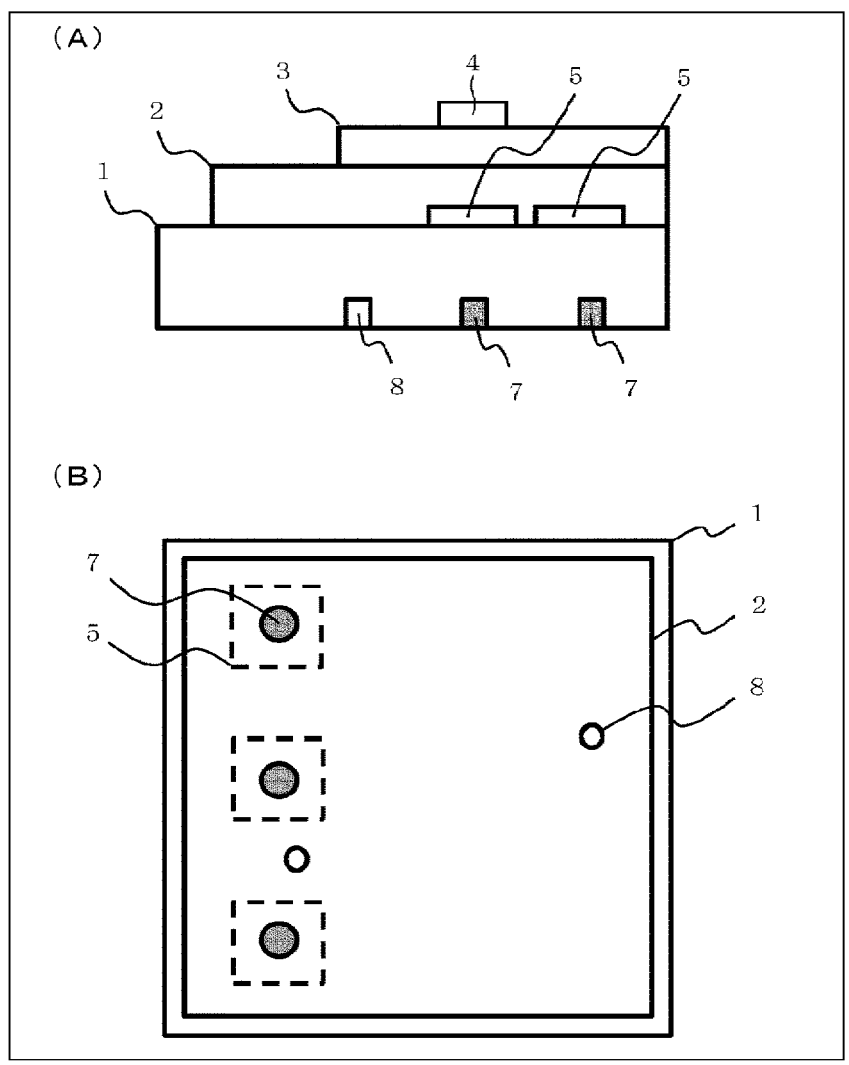
FIG. 2(A) is a cross-sectional view illustrating a configuration example of the display device during manufacturing.
FIG. 2(B) is a plan view illustrating a configuration example of the display device during manufacturing.

FIG. 2(A) is a cross-sectional view illustrating a configuration example of the display device during manufacturing, and FIG. 2(B) is a plan view illustrating a configuration example of the display device during manufacturing.

In the present embodiment, marks 7 (corresponding to the first regions) and a mark 8 detected by observation by automated optical inspection (AOI) are formed on the back face of the support substrate 1. As illustrated in FIG. 2(B), the marks 7 are arranged in a substantially straight line. The marks 7 such as these are easily produced by a transport device (for example, a stage), etc. provided in the manufacturing apparatus.

In the present embodiment, regions where the marks 7 in the back face of the support substrate 1 are formed are stored as the first regions. Peeling layers 5 are respectively formed on the second regions in the surface of the support substrate 1 opposing corresponding ones of the first regions. As illustrated in FIGS. 2(A) and 2(B), one peeling layer 5 is formed per one second region of the plurality of second regions.

The resin layer 2 is formed on the support substrate 1 so as to cover the peeling layers 5. The TFT layer 3 is then formed on the resin layer 2. The light-emitting element 4 is then formed on the TFT layer 3. Then the support substrate 1 and the resin layer 2 are peeled off.

When the interface between the support substrate 1 and the resin layer 2 is irradiated with laser light from the back face side of the support substrate 1, the marks 7 prevent the interface between the support substrate 1 and the peeling layers 5 from being irradiated with laser light. However, peeling failure of the support substrate 1 and the resin layer 2 can be prevented by the peeling layers 5.

3. Third Embodiment

Figure 3:
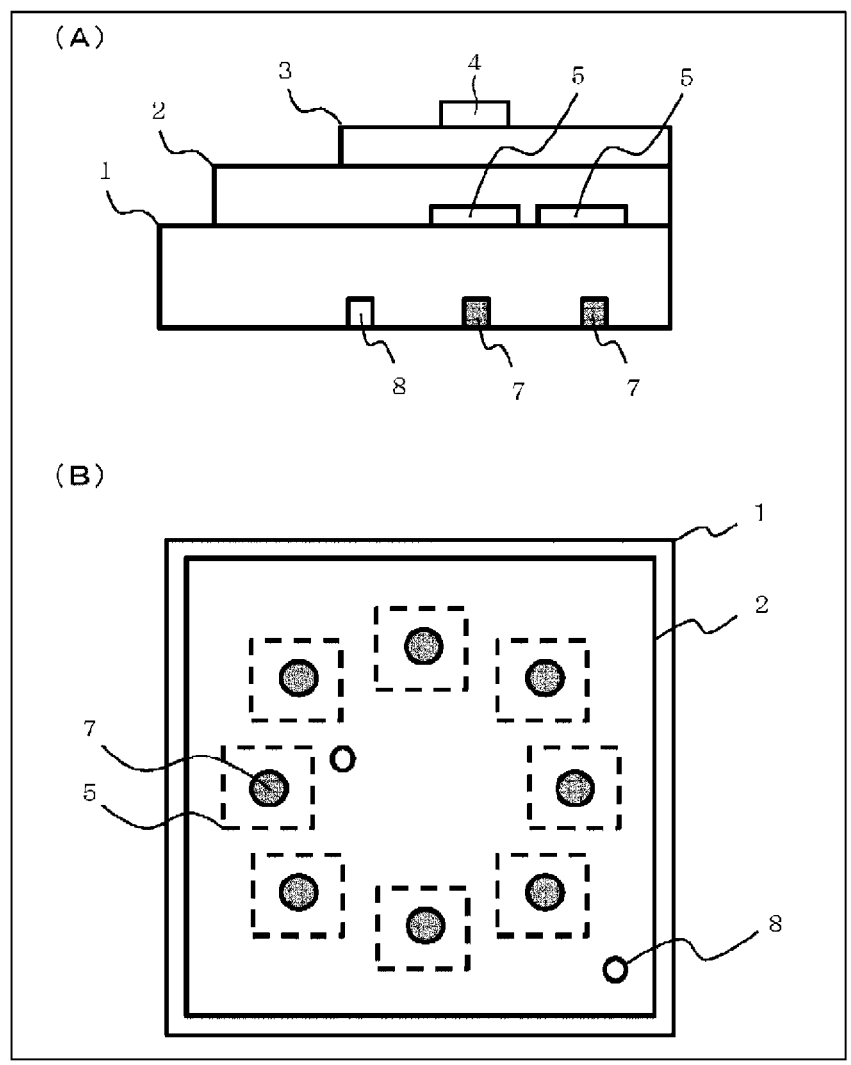
FIG. 3(A) is a cross-sectional view illustrating a configuration example of the display device during manufacturing.
FIG. 3(B) is a plan view illustrating a configuration example of the display device during manufacturing.

FIG. 3(A) is a cross-sectional view illustrating a configuration example of the display device during manufacturing, and FIG. 3(B) is a plan view illustrating a configuration example of the display device during manufacturing.

In the present embodiment, the marks 7 (corresponding to the first regions) and the mark 8 detected by observation by AOI are formed on the back face of the support substrate 1. As illustrated in FIG. 3(B), the marks 7 are substantially arranged in a circular shape. Such marks 7 are easily produced by the vacuum adsorption port, etc. provided in the manufacturing apparatus.

In the present embodiment, regions where the marks 7 in the back face of the support substrate 1 are formed are stored as the first regions. Peeling layers 5 are respectively formed the second regions in the surface of the support substrate 1 opposing corresponding ones of the first regions. As illustrated in FIGS. 3(A) and 3(B), one peeling layer 5 is formed per one second region of the plurality of second regions.

The resin layer 2 is formed on the support substrate 1 so as to cover the peeling layers 5. The TFT layer 3 is then formed on the resin layer 2. The light-emitting element 4 is then formed on the TFT layer 3. Then the support substrate 1 and the resin layer 2 are peeled off.

When the interface between the support substrate 1 and the resin layer 2 is irradiated with laser light from the back face side of the support substrate 1, the marks 7 prevent the laser light from being irradiated to the interface between the support substrate 1 and the peeling layers 5. However, peeling failure of the support substrate 1 and the resin layer 2 can be prevented by the peeling layers 5.

4. Fourth Embodiment

Figure 4:
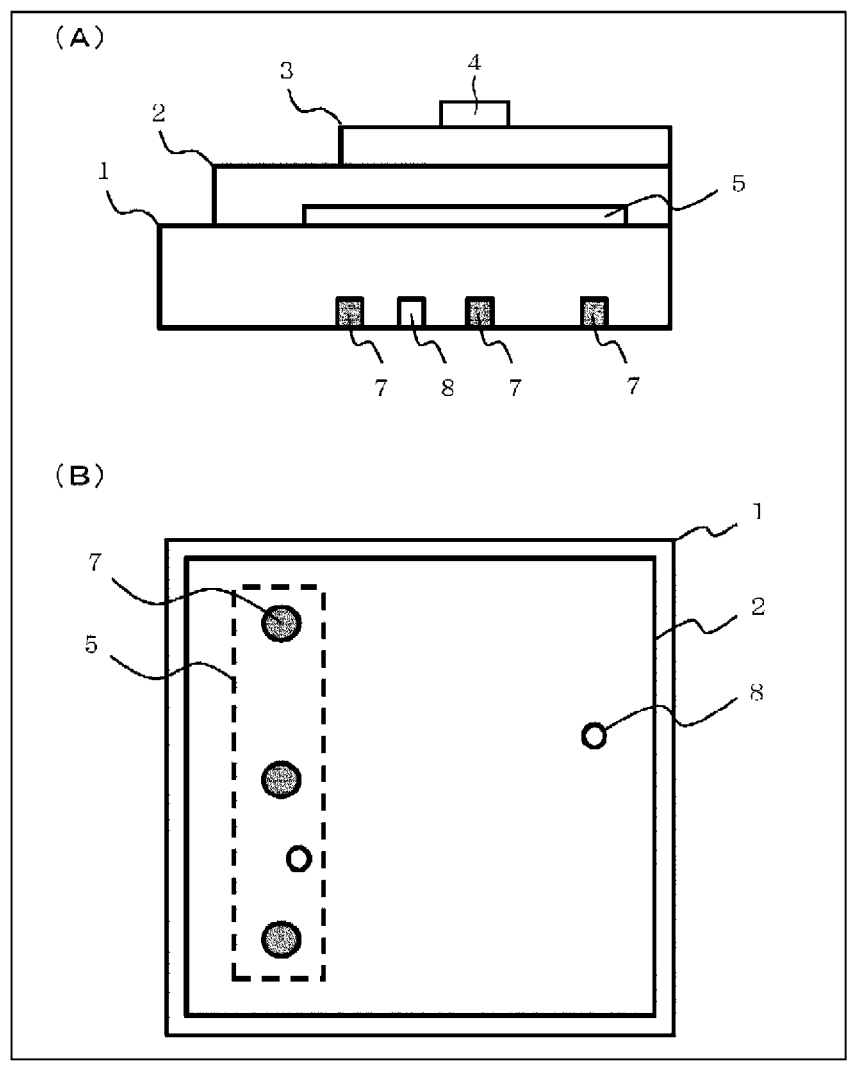
FIG. 4(A) is a cross-sectional view illustrating a configuration example of the display device during manufacturing.
FIG. 4(B) is a plan view illustrating a configuration example of the display device during manufacturing.

FIG. 4(A) is a cross-sectional view illustrating a configuration example of the display device during manufacturing, and FIG. 4(B) is a plan view illustrating a configuration example of the display device during manufacturing.

In the present embodiment, marks 7 (corresponding to the first regions) and a mark 8 detected by observation by AOI are formed on the back face of the support substrate 1. As illustrated in FIG. 4(B), the marks 7 are arranged in a substantially straight line. The marks 7 such as these are easily produced by the transport device (for example, a stage), etc. provided in the manufacturing apparatus.

In the present embodiment, regions where the marks 7 in the back face of the support substrate 1 are formed are stored as the first regions. A peeling layer 5 is formed on the second regions in the surface of the support substrate 1 opposing the first regions. As illustrated in FIGS. 4(A) and 4(B), one peeling layer 5 is formed for the plurality of second regions. In addition, as illustrated in FIGS. 4(A) and 4(B), the peeling layer 5 is also formed on the region in the surface of the support substrate 1 opposing the region where the mark 8 in the back face of the support substrate 1 is formed.

The resin layer 2 is formed on the support substrate 1 so as to cover the peeling layer 5. The TFT layer 3 is then formed on the resin layer 2. The light-emitting element 4 is then formed on the TFT layer 3. Then the support substrate 1 and the resin layer 2 are peeled off.

When the interface between the support substrate 1 and the resin layer 2 is irradiated with laser light from the back face side of the support substrate 1, the marks 7 prevent the laser light from being irradiated to the interface between the support substrate 1 and the peeling layer 5. However, peeling failure between the support substrate 1 and the resin layer 2 can be prevented by the peeling layer 5.

In the second and third embodiments, the peeling layers 5 that are small are individually formed in accordance with the size of individual ones of the plurality of marks 7. As a result, in the second and third embodiments, compared with the fourth embodiment, the total area of the region where the peeling layers 5 are formed is reduced. As a result, the second and third embodiments have an advantage in that, compared with the fourth embodiment, the occurrence of variation in the thickness of the resin layer 2 formed on the peeling layers 5, and the occurrence of unevenness in the surface of the resin layer 2 can be better prevented.

On the other hand, in the fourth embodiment, the peeling layer 5 that is large is formed. The peeling layer 5 that is large (corresponding to the fourth embodiment) has a higher likelihood of covering the region in the surface of the support substrate 1 opposing the mark 8 in the back face of the support substrate 1 compared with the peeling layers 5 that are small (corresponding to the second and third embodiments). In other words, the fourth embodiment has an advantage in that peeling failure originating from accidental defects can be prevented compared with the second and third embodiments.

5. Other Displays

The above embodiments illustrate examples of application to an organic electro luminescence (EL) display panel including an organic light-emitting diode (OLED), but are not limited thereto as long as there is a display panel including a display element. The aforementioned display element is a display element having luminance and transmittance that are controlled by an electric current, which can be applied to, for example, a QLED display, etc. including an EL display quantum dot light-emitting diode (QLED) such as an inorganic EL display including an inorganic light-emitting diode.

6. Supplement

First Aspect

A method for manufacturing a display device including a light-emitting element, includes storing, in a manufacturing process of the display device, a plurality of abutting positions where a back face of a support substrate locally abuts a manufacturing apparatus, forming, on a surface of the support substrate on a side on which the light-emitting element is to be formed, a peeling layer at a position opposing at least one position of the plurality of abutting positions stored, forming, on the support substrate, a resin layer to cover the peeling layer, forming a TFT layer on the resin layer, forming the light-emitting element on the TFT layer, and peeling the support substrate and the resin layer.

Second Aspect

In the method for manufacturing a display device according to the first aspect, after the forming of the light-emitting element, forming of a sealing layer for sealing the light-emitting element, and applying of a first lamination film onto the sealing layer, are sequentially performed.

Third Aspect

In the method for manufacturing a display device according to the first aspect or the second aspect, the peeling includes radiating light for peeling the peeling layer from the support substrate, performing laser lift-off for peeling the resin layer from the support substrate, and delaminating for peeling the resin layer from the support substrate.

Fourth Aspect

In the method for manufacturing a display device according to third aspect, in the peeling, the radiating of light and the laser lift-off are performed simultaneously.

Fifth Aspect

In the method for manufacturing a display device according to any one of the first aspect to the fourth aspect, after the peeling, applying of a second lamination film onto the resin layer, and singulating for division into units of the display device, are sequentially performed.

Sixth Aspect

In the method for manufacturing a display device according to any one of the first aspect to the fifth aspect, the storing includes observing the back face of the support substrate to detect a mark formed on the back face, and storing a position of the detected mark.

Seventh Aspect

In the method for manufacturing a display device according to the sixth aspect, when a plurality of the marks are detected in the storing step, the peeling layer is formed for each detected mark of the plurality of marks in the forming of the peeling layer.

Eighth Aspect

In the method for manufacturing a display device according to the sixth aspect, when a plurality of the marks are detected in the storing step, the peeling layer is formed to cover the detected plurality of marks in the peeling layer forming step.

Ninth Aspect

In the method for manufacturing a display device according to any one of the first aspect to the eighth aspect, each of the plurality of abutting positions is a position of a support pin of the manufacturing apparatus, the support pin abutting the support substrate.

Tenth Aspect

In the method for manufacturing a display device according to any one of the first aspect to the eighth aspect, each of the plurality of abutting positions is a position of a vacuum adsorption port of the manufacturing apparatus, the vacuum adsorption port abutting the support substrate.

Eleventh Aspect

In the method for manufacturing a display device according to any one of the first aspect to the tenth aspect, in the forming of the peeling layer, an end portion of the peeling layer is formed in a cross-sectional R shape.

Twelfth Aspect

In the method for manufacturing a display device according to any one of the first aspect to the eleventh aspect, in the forming of the peeling layer, the peeling layer is formed using a silicon-based peeling film.

Thirteenth Aspect

In the method for manufacturing a display device according to any one of the first aspect to the eleventh aspect, in the forming of the peeling layer, the peeling layer is formed using a UV peeling film.

Fourteenth Aspect

In the method for manufacturing a display device according to any one of the first aspect to the eleventh aspect, in the forming of the peeling layer, the peeling layer is formed using a metal-based peeling film.

Fifteenth Aspect

In the method for manufacturing a display device according to any one of the first aspect to the eleventh aspect, in the forming of the peeling layer, the peeling layer is formed using a photocatalyst-based peeling film.

Sixteenth Aspect

In the method for manufacturing a display device according to any one of the first aspect to the eleventh aspect, in the forming of the peeling layer, the peeling layer is formed using an interface modification film.

The invention claimed is:

1. A method for manufacturing a display device including a light-emitting element, the method comprising:
   storing, in a manufacturing process of the display device, a plurality of abutting positions where a back face of a support substrate locally abuts a manufacturing apparatus;
   forming, on a surface of the support substrate on a side on which the light-emitting element is to be formed, a peeling layer at a position opposing at least one position of the plurality of abutting positions stored;
   forming, on the support substrate, a resin layer to cover the peeling layer;
   forming a TFT layer on the resin layer;
   forming the light-emitting element on the TFT layer; and
   peeling the support substrate and the resin layer.

2. The method for manufacturing a display device according to claim 1,
   wherein, after the forming of the light-emitting element, forming of a sealing layer for sealing the light-emitting element and applying of a first lamination film onto the sealing layer, are sequentially performed.

3. The method for manufacturing a display device according to claim 1,
   wherein the peeling includes radiating light for peeling the peeling layer from the support substrate, performing laser lift-off for peeling the resin layer from the support substrate, and delaminating for peeling the resin layer from the support substrate.

4. The method for manufacturing a display device according to claim 3,
   wherein in the peeling step, the radiating of light and the laser lift-off are performed simultaneously.

5. The method for manufacturing a display device according to claim 1,
   wherein, after the peeling step, applying of a second lamination film onto the resin layer and singulating for division into units of the display device, are sequentially performed.

6. The method for manufacturing a display device according to claim 1,
   wherein the storing includes observing the back face of the support substrate to detect a mark formed on the back face, and storing a position of the detected mark.

7. The method for manufacturing a display device according to claim 6,
   wherein when a plurality of the marks are detected in the storing, the peeling layer is formed for each detected mark of the plurality of marks in the forming of the peeling layer.

8. The method for manufacturing a display device according to claim 6,
   wherein when a plurality of the marks are detected in the storing, the peeling layer is formed to cover the detected plurality of marks in the forming of the peeling layer.

9. The method for manufacturing a display device according to claim 1,
   wherein each of the plurality of abutting positions is a position of a support pin of the manufacturing apparatus, the support pin abutting the support substrate.

10. The method for manufacturing a display device according to claim 1,
    wherein each of the plurality of abutting positions is a position of a vacuum adsorption port of the manufacturing apparatus, the vacuum adsorption port abutting the support substrate.

11. The method for manufacturing a display device according to claim 1,
    wherein, in the forming of the peeling layer, an end portion of the peeling layer is formed in a cross-sectional R shape.

12. The method for manufacturing a display device according to claim 1,
    wherein, in the forming of the peeling layer, the peeling layer is formed using a silicon-based peeling film.

13. The method for manufacturing a display device according to claim 1,
    wherein, in the forming of the peeling layer, the peeling layer is formed using a UV peeling film.

14. The method for manufacturing a display device according to claim 1,
    wherein, in the forming of the peeling layer, the peeling layer is formed using a metal-based peeling film.

15. The method for manufacturing a display device according to claim 1,
    wherein, in forming of the peeling layer, the peeling layer is formed using a photocatalyst-based peeling film.

16. The method for manufacturing a display device according to claim 1,
    wherein, in the forming of the peeling layer, the peeling layer is formed using an interface modification film.

* * * * *